(12) United States Patent
Lee

(10) Patent No.: US 7,999,370 B2
(45) Date of Patent: Aug. 16, 2011

(54) SEMICONDUCTOR CHIP CAPABLE OF INCREASED NUMBER OF PADS IN LIMITED REGION AND SEMICONDUCTOR PACKAGE USING THE SAME

(75) Inventor: Seung Yeop Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 277 days.

(21) Appl. No.: 12/433,129

(22) Filed: Apr. 30, 2009

(65) Prior Publication Data

US 2010/0059874 A1    Mar. 11, 2010

(30) Foreign Application Priority Data

Sep. 10, 2008 (KR) ........................ 10-2008-0089463

(51) Int. Cl.
*H01L 23/48* (2006.01)
(52) U.S. Cl. ........ 257/690; 257/780; 257/781; 257/782; 257/784; 257/E23.02; 257/E23.068
(58) Field of Classification Search .................. 257/690, 257/737, 738, 780–782, 784, E23.02, E23.021, 257/E23.068, E23.069; 228/180.22; 438/612–614
See application file for complete search history.

(56) References Cited

U.S. PATENT DOCUMENTS

| 6,249,051 | B1 * | 6/2001 | Chang et al. | 257/737 |
| 6,995,474 | B1 * | 2/2006 | Ho et al. | 257/781 |
| 7,227,263 | B2 * | 6/2007 | Yamaguchi | 257/738 |
| 7,355,280 | B2 * | 4/2008 | Matsushima et al. | 257/738 |
| 7,586,187 | B2 * | 9/2009 | Hsu et al. | 257/698 |

FOREIGN PATENT DOCUMENTS

| KR | 1020050047298 A | 5/2005 |
| KR | 1020060036242 A | 4/2006 |

* cited by examiner

*Primary Examiner* — Jasmine J Clark
(74) *Attorney, Agent, or Firm* — Ladas & Parry LLP

(57) ABSTRACT

A semiconductor package includes a semiconductor chip including a body unit having one or more circuit units. A first bonding pad is disposed in a first face of the body unit and is connected to a circuit unit. A second bonding pad is disposed in the first face of the body unit in the bonding pad region so as to be positioned in an adjacent surrounding area of the first bonding pad and borders at least one side face of the first bonding pad while being insulated from the first bonding pad. A first connection terminal is attached onto the first bonding pad, and a second connection terminal is attached onto the second bonding pad and is positioned in an adjacent surrounding area of the first connection terminal and borders at least one side face of the first connection terminal while being insulated from the first connection terminal.

24 Claims, 6 Drawing Sheets

SEMICONDUCTOR CHIP CAPABLE OF INCREASED NUMBER OF PADS IN LIMITED REGION AND SEMICONDUCTOR PACKAGE USING THE SAME

CROSS-REFERENCE TO RELATED APPLICATIONS

The present application claims priority to Korean patent application number 10-2008-0089463 filed on Sep. 10, 2008, which is incorporated herein by reference in its entirety.

BACKGROUND OF THE INVENTION

The present invention relates to a semiconductor chip and a semiconductor package using the same.

Recent developments in semiconductor technology have resulted in semiconductor chips both capable of storing massive amounts of data and processing the data, and a semiconductor package having the same.

One such development is a flip chip semiconductor package in which a semiconductor chip is directly bonded on a substrate in order to reduce the size of the semiconductor package. The advantages of a flip chip type semiconductor package are a fast signal transfer speed, a simplified circuit design, and superior electrical and thermal properties.

Recently developed semiconductor chips have an increased number of pads through which signals are inputted or outputted when compared to their predecessors. However, at the same time, the size of semiconductor chips is constantly being decreased. As semiconductor chips become smaller and the number of input/output signals is increased, it becomes more and more difficult to arrange the requisite number of pads within the limited size of a semiconductor chip.

SUMMARY OF THE INVENTION

Embodiments of the present invention include a semiconductor chip capable of forming more pads within a limited region to thereby reduce the total size of the semiconductor chip, and a semiconductor package using the same.

In one aspect of the present invention, a semiconductor chip includes a body unit having one or more circuit units; a first bonding pad disposed in a first face of the body unit and connected to a circuit unit; and a second bonding pad disposed in the first face of the body unit, connected to a circuit unit and bordering at least one side face of the first bonding pad while being insulated from the first bonding pad.

The semiconductor chip may further include a first insulation layer disposed between the first bonding pad and the second bonding pad to insulate the first bonding pad from the second bonding pad.

The first bonding pad may have a circular or polygonal shape when viewed from the top.

The second bonding pad may have a polygonal closed loop shape including a ring and a rectangle to surround the first bonding pad when viewed from the top.

Alternatively, the second bonding pad may have a "C" shape or an "L" shape to border at least one side face of the first bonding pad when viewed from the top.

The first bonding pad and the second bonding pad are disposed in the first face of the body unit in plural pairs, the pair consisting of the first bonding pad and the second bonding pad.

In another aspect of the present invention, a semiconductor package includes a semiconductor chip including a body unit having one or more circuit units, a first bonding pad disposed in a first face of the body unit and connected to a circuit unit, and a second bonding pad disposed in the first face of the body unit, connected to a circuit unit and bordering at least one side face of the first bonding pad while being insulated from the first bonding pad; a first connection terminal attached onto the first bonding pad; and a second connection terminal attached onto the second bonding pad and bordering at least one side face of the first connection terminal while being insulated from the first connection terminal.

The semiconductor package may further include a second insulation layer disposed between the first connection terminal and the second connection terminal to insulate the first connection terminal from the second connection terminal.

The semiconductor package may further include a substrate having a first connection pad disposed in a portion of the substrate corresponding to the first connection terminal connected to the first bonding pad, and a second connection pad disposed in a portion of the substrate corresponding to the second connection terminal connected to the second bonding pad, attached to the second connection terminal, and bordering at least one side face of the first connection pad while being insulated with the first connection pad.

The semiconductor package may further include a first insulation layer disposed between the first bonding pad and the second bonding pad to insulate the first bonding pad from the second bonding pad; and a third insulation layer disposed between the first connection pad and the second connection pad to insulate the first connection pad from the second connection pad.

The first bonding pad, the first connection terminal and the first connection pad have shapes corresponding to one another, and the second bonding pad, the second connection terminal and the second connection pad have shapes corresponding to one another.

The first bonding pad, the first connection terminal and the first connection pad may each have a circular or polygonal shape when viewed from the top.

The second bonding pad, the second connection terminal and the second connection pad may each have a polygonal closed loop shape including a ring and a rectangle to surround the first bonding pad, the first connection terminal and the first connection pad, respectively, when viewed from the top.

Alternatively, the second bonding pad, the second connection terminal and the second connection pad may have a "C" shape or a "L" shape to border at least one side face of the first bonding pad, the first connection terminal and the first connection pad, respectively, when viewed from the top.

The first bonding pad and the second bonding pad are disposed in the first face of the body unit in plural pairs, the pair consisting of the first bonding pad and the second bonding pad.

The substrate may include a first ball land disposed in a second face opposite to the first face of the substrate and a second ball land disposed in the second face to border at least one side face of the first ball land with being insulated from the first ball land.

The semiconductor package may further include a fourth insulation layer disposed between the first ball land and the second ball land to insulate the first ball land from the second ball land.

The semiconductor package may further include a first external connection terminal attached onto the first ball land, and a second external connection terminal attached onto the second ball land to border at least one side face of the first external connection terminal while being insulated from the first external connection terminal.

The semiconductor package may further include a fifth insulation layer disposed between the first external connection terminal and the second external connection terminal to insulate the first external connection terminal and the second connection terminal.

The first ball land and the first external connection terminal have shapes corresponding to each other, and the second ball land and the second external connection terminal have shapes corresponding to each other.

The first ball land and the first external connection terminal may each have a circular or polygonal shape when viewed from the top.

The second ball land and the second external connection terminal may each have a polygonal closed loop shape including a ring and a rectangle to surround the first ball land and the first external connection terminal, respectively, when viewed from the top.

Alternatively, the second ball land and the second external connection terminal may have a "C" shape or an "L" shape to border at least one side face of the first ball land and the first external connection terminal, respectively, when viewed from the top.

The first ball land and the second ball land are disposed in the first face of the body unit in plural pairs, the pair consisting of the first ball land and the second ball land.

DESCRIPTION OF SPECIFIC EMBODIMENTS

Embodiments of the present invention provide a semiconductor chip and a semiconductor package, in which two or more pads are formed in a pad forming region conventionally having only one pad formed therein to overcome limitations in pad arrangement caused when the sizes of the semiconductor chip and substrate are reduced and the number of the pads is increased.

The semiconductor package in accordance with an embodiment of the present invention includes a semiconductor chip comprising a body unit that includes a circuit unit, a first bonding pad disposed on a first face of the body unit and connected to the circuit unit, and a second bonding pad disposed on the first face of the body unit and positioned in the adjacent surrounding area, which is an area within a pad forming region conventionally having only one pad formed therein, of the first bonding pad so as to be adjacent to and bordering at least one side face of the first bonding pad; a first connection terminal attached onto the first bonding pad; and a second connection terminal attached onto the second bonding pad and positioned in the adjacent surrounding area of the first connection terminal so as to be adjacent to and bordering at least one side face of the first connection terminal while being insulated from the first connection pad.

Hereinafter, a semiconductor chip and a semiconductor packages in accordance with various embodiments of the present invention will be described in detail.

Figure 1A:
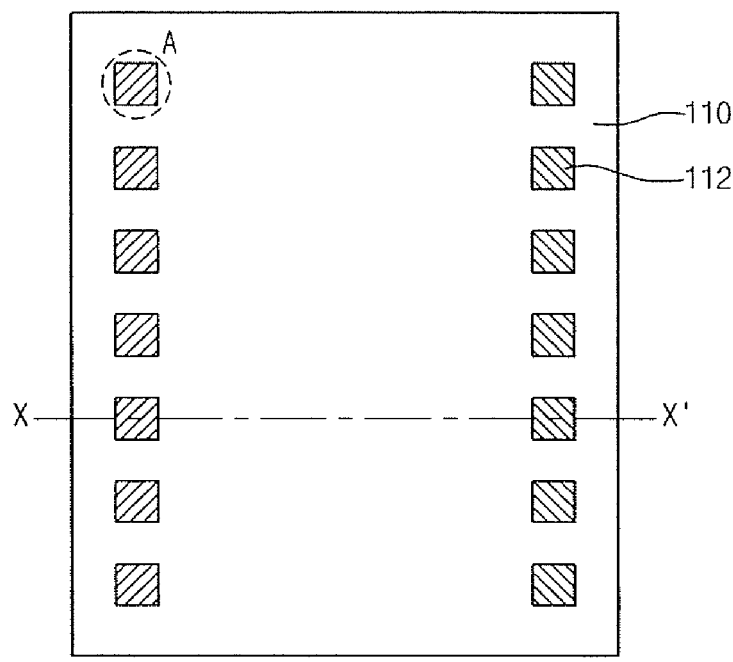
FIG. 1A is a plan view showing a semiconductor chip in accordance with an embodiment of the present invention.
Figure 1B:
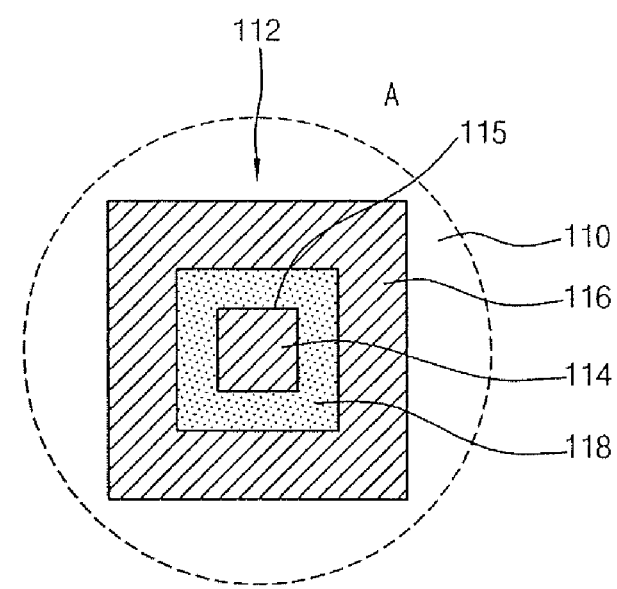
FIG. 1B is an enlarged plan view of portion 'A' in FIG. PA.
Figure 1C:
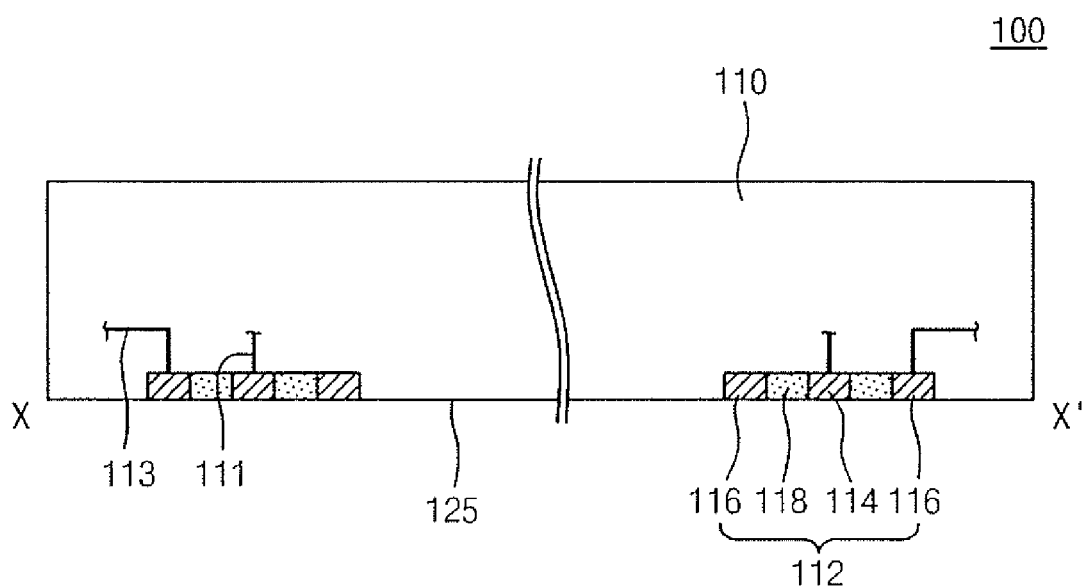
FIG. 1C is a cross-sectional view taken along a line X-X' in FIG. 1A.

FIG. 1A is a plan view showing a semiconductor chip in accordance with an embodiment of the present invention; FIG. 1B is an enlarged plan view of portion 'A' in FIG. 1A; FIG. 1C is a cross-sectional view taken along line X-X' in FIG. 1A; and FIGS. 2A through 2E are plan views showing bonding pad units in accordance with embodiments of the present invention.

Referring to FIGs. 1A through 1C, a semiconductor chip 100 in accordance with an embodiment of the present invention includes a body unit 110 and a plurality of bonding pad units 112 each disposed in a bonding pad region A.

The body unit 11 includes circuit units 111, 113 including a data storage unit and a data processing unit therein.

The bonding pad unit 112 disposed in the bonding pad region A includes a first bonding pad 114, a second bonding pad 116 and a first insulation layer 118. As shown in FIG. 5C, the bonding pad units, each including the first bonding pad 114 and the second bonding pad 116, are arranged in pairs across a first direction of the semiconductor chip. A plurality of the pairs of bonding pad units are disposed in a second direction that is perpendicular to the first direction, as is shown in FIG. 1A of the present invention.

The first bonding pad 114 is disposed in a first face 125 of the body unit 110. According to an embodiment of the present invention, the first bonding has a polygonal shape (for example, in the embodiment of the present invention shown in FIG. 1B, the first bonding pad 114 has a rectangular shape) when viewed from the top and is electrically connected to the first circuit unit 111 within the body unit 110.

The second bonding pad 116 is disposed, like the first bonding pad 114, in the first face of the body unit 110, and is insulated from the first bonding pad 114. Also, the second bonding pad 116 is electrically connected to the second circuit unit 113 within the body unit 110. The second bonding pad is disposed in the bonding pad region A in the adjacent surrounding area of the first bonding pad 114 so as to be adjacent to and bordering at least one side face 115 of the first bonding pad 114. The second bonding pad 116 preferably has a rectangular closed loop shape so as to surround the first bonding pad when viewed from the top, as is shown in FIG. 2.

The first insulation layer 118 is interposed between the first bonding pad 114 and the second bonding pad 116 to electrically insulate the first bonding pad 114 from the second bonding pad 116.

The first bonding pad 114 and the second bonding pad 116 can have various shapes as shown in FIGS. 2A through 2E.

Figure 2A:
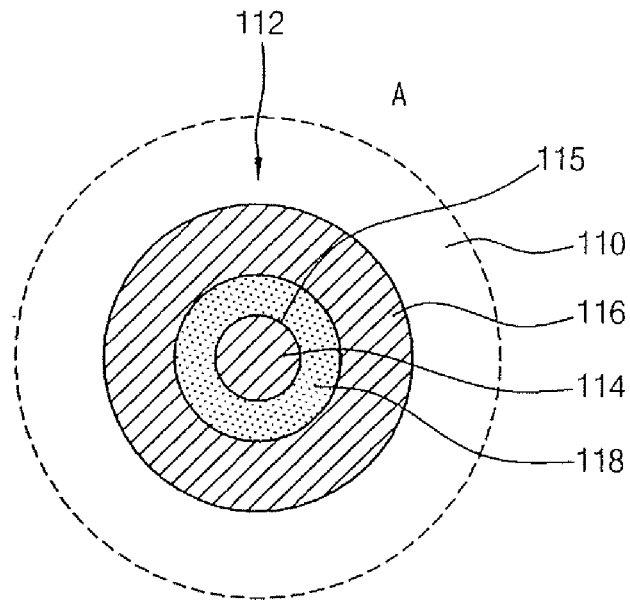
FIGS. 2A through 2E are plan views showing bonding pad units in accordance with embodiments of the present invention.

For example, referring to FIG. 2A, the first bonding pad 113 has a circular shape when viewed from the top, and the second bonding pad 116 has a ring shape that surrounds the first bonding pad 114.

Figure 2B:
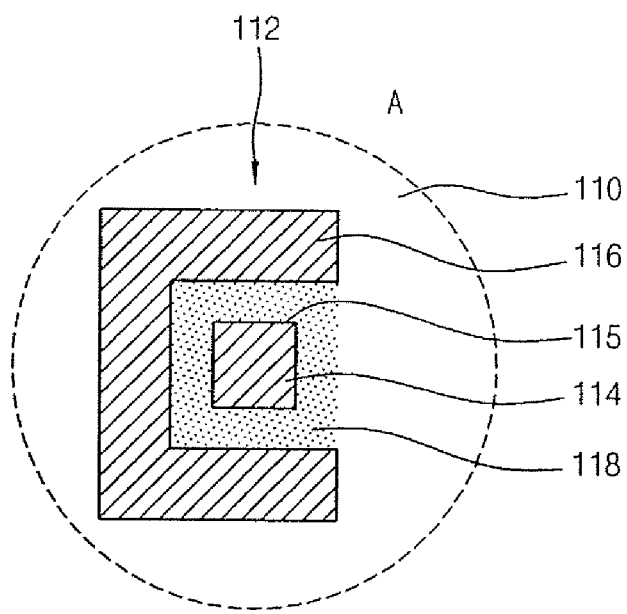
Figure 2C:
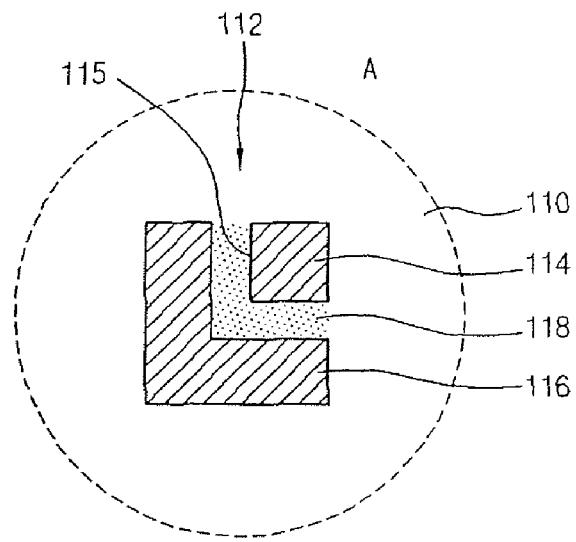

Also, referring to FIGS. 2B and 2C, the second bonding pad 116 disposed in the bonding pad region A has a "C" shape and an "L" shape, respectively. In each of FIGS. 2B and 2C the second bonding pad 116 disposed in the bonding pad region A is formed in the adjacent surrounding area of the first bonding pad 114 so as to be adjacent to and bordering at least one side face 115 of the first bonding pad when viewed from the top. In the embodiment of the present invention shown in FIG. 2B, the "C" shaped second bonding pad 116 is adjacent to and bordering three side faces of the first bonding pad 114, and in the embodiment shown in FIG. 2C, the "L" shaped second bonding pad 116 is adjacent to and bordering two side faces of the first bonding pad 114 when viewed from the top. The second bonding pad 116 may also have, though not shown, a bar shape which is adjacent to and bordering one side face of the first bonding pad 114.

Figure 2D:
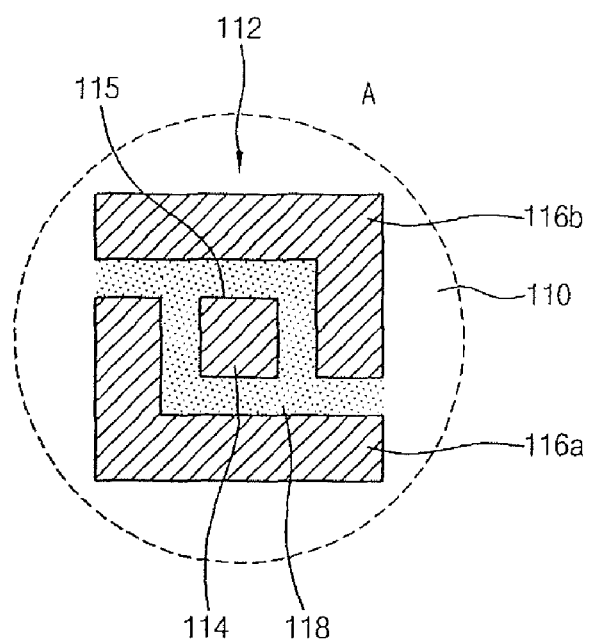
Figure 2E:
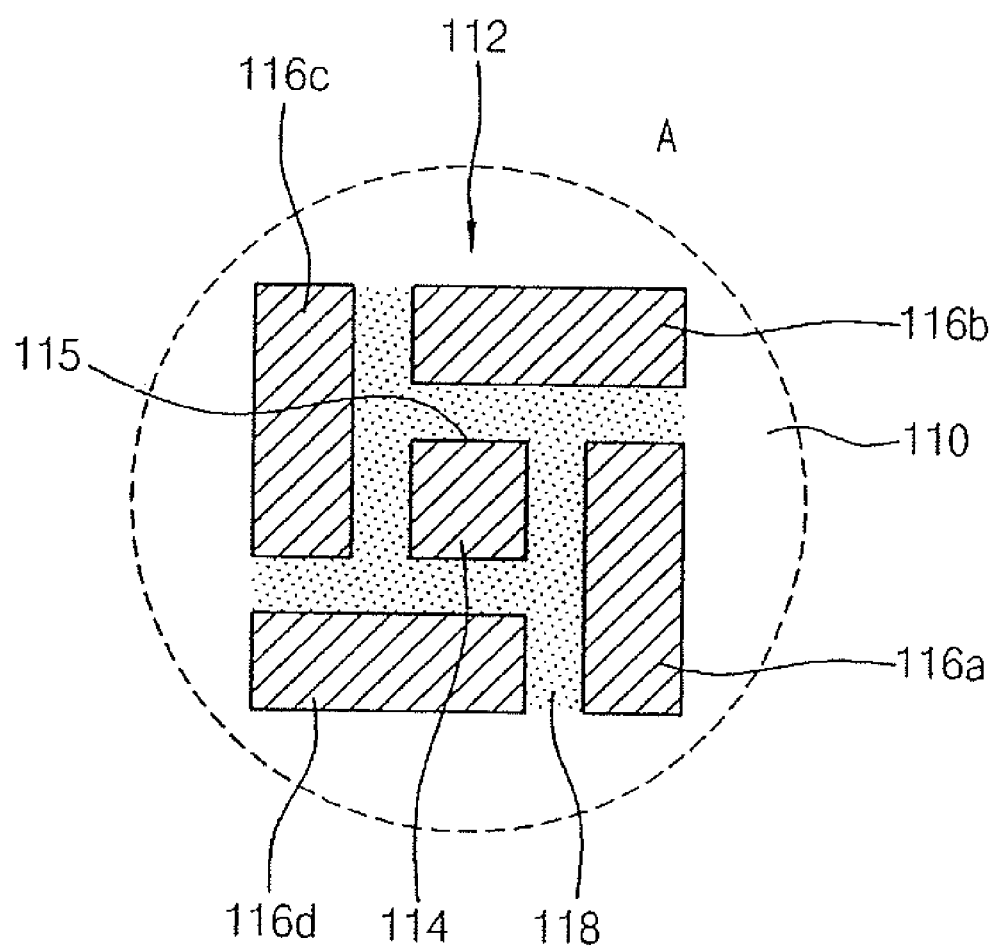

In addition, as shown in FIGS. 2D and 2E, a plurality of the second bonding pads 116a and 116b or 116a, 116b, 116c, 116d may be disposed in the bonding pad region A in the adjacent surrounding area of the first bonding pad 114 so as to be adjacent to and bordering at least one side face 115 of the second bonding pad. As shown in FIGS. 2D and 2E, the respective second bonding pads 116a, 116B and 116a, 116b, 116c, 116d are insulated from each other by the first insulation layer 118. In each of FIGS. 2D an 2E, the plural second bonding pads 116a, 116B and 116a, 116b, 116c, 116d are formed such that they collectively surround the first bonding pad 114 when viewed from the top.

Figure 3:
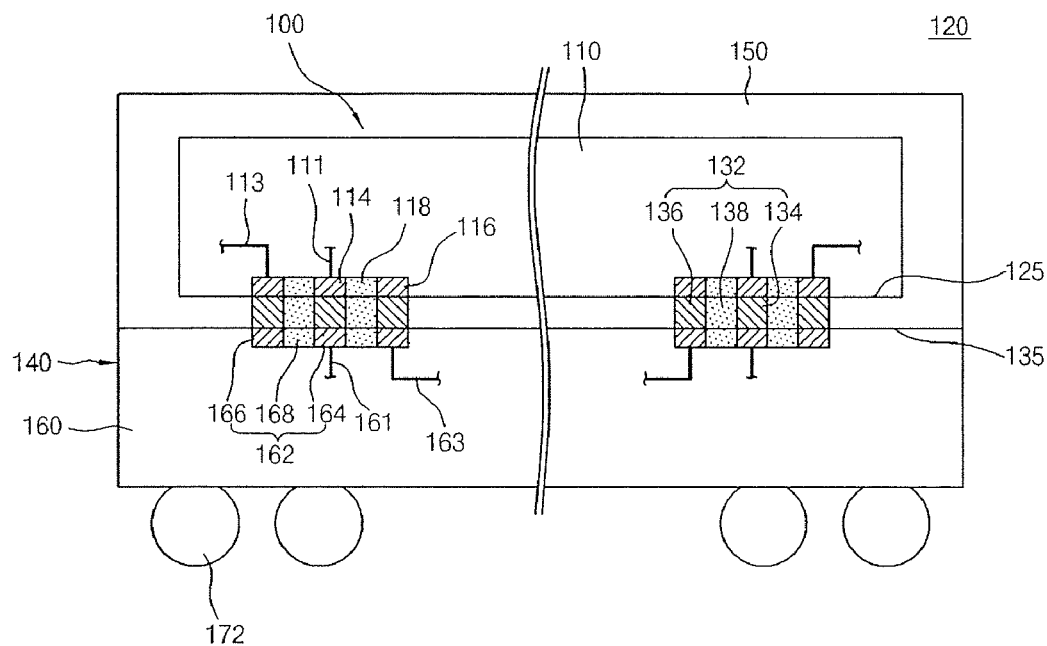
FIG. 3 is a cross-sectional view showing a semiconductor package in accordance with an embodiment of the present invention.

FIG. 3 is a cross-sectional view showing a semiconductor package in accordance with an embodiment of the present invention.

The semiconductor package shown in FIG. 3 includes elements which are substantially the same as those shown in the semiconductor chip shown in FIGS. 1A to 1C. Therefore, a description of the same elements will be omitted and same names and reference numerals will be given to these same elements.

The semiconductor package 120 in accordance with an embodiment of the present invention includes the semiconductor chip 100, a substrate 140, and a plurality of connection terminal units 132 for connecting the semiconductor chip 100 to the substrate 140.

The connection terminal unit 132 includes a first connection terminal 134 in contact with the first bonding pad 114 formed in the first face 135 of the semiconductor chip 100 and electrically connected to the first bonding pad 114, a second connection terminal 136 in contact with the second bonding pad 116 and electrically connected to the second bonding pad 116, and a second insulation layer 138 interposed between the first connection terminal 134 and the second connection terminal 136 for electrical insulation.

The second connection terminal 136 is insulated from the first connection terminal 134 and disposed in the adjacent surrounding area of the first connection terminal 134 so as to be adjacent to and bordering at least one side face of the first connection terminal 134.

The substrate 140 includes a substrate body 160 provided with wiring units 161, 163 therein and a plurality of connection pad units 162. Each connection pad unit includes a first connection pad 164 and a second connection pad 166 disposed in a first face 135 of the substrate body 160 that faces the first face 125 of the body unit 110 and a third insulation layer 168 interposed between the first connection pad 164 and the second connection pad 166 for electrical insulation.

The first connection pad 164 is connected to the first wiring unit 161 and is disposed in a portion of the first face 135 corresponding to the first connection terminal 134 connected to the first bonding pad 114 to be attached to the first connection terminal 134. The second connection pad 166 is connected to the wiring unit 163 inside the substrate body 160 and is disposed in a portion of the first face 135 corresponding to the second connection terminal 136 connected to the second bonding pad 116. Also, the second connection pad 166 is positioned in the adjacent surrounding area of the first connection pad 164 so as to be adjacent to and bordering at least one side face of the first connection pad 164 while being insulated from the first connection pad 164 by the third insulation layer 168. The second connection pad 166 is attached to the second connection terminal 136.

The first bonding pad 114, the first connection terminal 134 and the first connection pad 164 have shapes corresponding to one another; and the second bonding pad 116, the second connection terminal 136 and the second connection pad 166 also have shapes corresponding to one another so as to allow the electrical connection of the first bonding pad to the first connection pad 164 and the second bonding pad 116 to the second connection terminal 136. For example, the first bonding pad 114, the first connection terminal 134 and the first connection pad 164 may have substantially the same shape; and the second bonding pad 116, the second connection terminal 136, and the second connection pad 166 may have substantially the same shape. More specifically, the second bonding pad 116, the second connection terminal 136 and the second connection pad 166 may each have, when viewed from the top, the shape of a polygonal closed loop such as a rectangle or the shape of a ring so as to surround the first bonding pad 114, the first connection terminal 134 and the first connection pad 164, respectively. In an alternative embodiment, the second bonding pad 116, the second connection terminal 136 and the second connection pad 166 can have, when viewed from the top, the shape of "C" or "L" in the adjacent surrounding area of the first bonding pad 114, the first connection terminal 134, and the first connection pad 164, respectively, so as to be adjacent to and bordering at least one side face of the first bonding pad 114, the first connection terminal 134 and the first connection pad 164, respectively.

An encapsulant 150 is formed over the upper face of the substrate 140 to cover the semiconductor chip 100, and external connection terminals 172, such as solder balls, are attached to a lower face of the substrate 140 that is opposite to the upper face.

Figure 4:
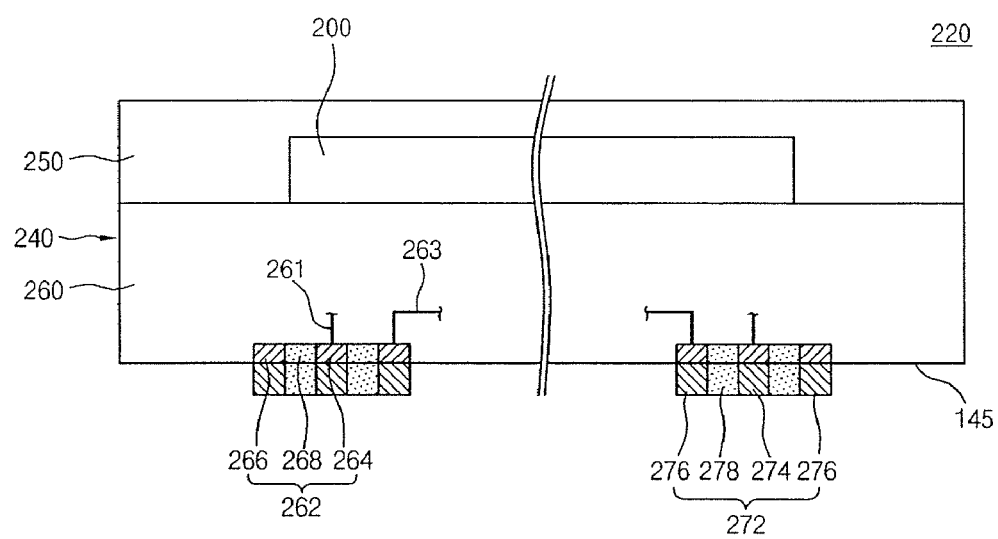
FIG. 4 is a cross-sectional view showing a semiconductor package in accordance with another embodiment of the present invention.

FIG. 4 is a cross-sectional view showing a semiconductor package in accordance with another embodiment of the present invention.

AS shown, the semiconductor package 220 in accordance with an embodiment of the present invention includes a semiconductor chip 200 and a substrate 240 having ball land units 262.

The substrate 240 includes a substrate body provided with wiring units 261, 263 and a plurality of ball land units 262 including a first ball land 264 and a second ball land 266 disposed in a second face 145 of the substrate body 260 and a fourth insulation layer 268 interposed between the first ball land 264 and the second ball land 266 for electrical insulation.

The first ball land 264 is connected to a first wiring unit 261, and the second ball land 266 is connected to the second wiring unit 263. The second ball land 266 is positioned in the adjacent surrounding area of the first ball land 264 so as to be adjacent to and bordering at least one side face of the first ball land 264 while being insulated from the first ball land 264 by the fourth insulation layer 268.

The semiconductor chip 200 is attached to a first face of the substrate 240 so as to be electrically connected to the substrate 240.

Each ball land unit 262 on a lower face (i.e., the second face 145) of the substrate 240 is attached to a corresponding external connection terminal unit 272 having a first external connection terminal 274, a second external connection terminal 276 and a fifth insulation layer 278 interposed between the first external connection terminal 274 and the second external connection terminal 276 for electrical insulation. Specifically, the first external connection terminal 274 is attached to the first ball land 264 on the lower face (i.e., the second face 145) of the substrate 240 so as to be electrically connected to the first ball land 264. The second external connection terminal 276 is attached onto the second ball land 266 and is positioned in the adjacent surrounding area of the first external connection terminal 274 so as to be adjacent to and bordering at least one side face of the first external connection terminal 274 while being insulated from the first external connection terminal 274.

The first ball land 264 and the first external connection terminal 274 have shapes corresponding to each other, and the second ball land 266 and the second external connection terminal 276 have shapes corresponding to each other so as to allow the electrical connection of the first ball land to the first external connection terminal 274 and the second ball land 266 to the second external connection terminal 276.

For example, the first ball land 264 and the first external connection terminal 274 may have substantially the same shape, and the second ball land 266 and the second external connection terminal 276 may also have substantially the same shape. More specifically, the first ball land 264 and the first external connection terminal 274 may each have a circular or polygonal shape when viewed from the top.

The second ball land 266 and the second external connection terminal 276 may have a polygonal closed loop shape, such as a rectangle, or a ring shape so as to surround the first ball land 264 and the first external connection terminal 274, respectively. In an alternative embodiment, the second ball land 266 and the second external connection terminal 276 can have, when viewed from the top, the shape of "C" or "L" in the adjacent surrounding area of the first external connection terminal 274 so as to be adjacent to and bordering at least one side face of the first ball land 264 and the first external connection terminal 274, respectively.

As is apparent from the above description, in the present invention, at least two pads electrically isolated from each other are disposed in a single pad region of the semiconductor chip and the substrate, through which conventionally only one electric signal can be transferred.

Therefore, in the present invention, it is possible to reduce the size of the semiconductor chip since an increased number of pads can be formed in a semiconductor chip within limited region, and it is thus possible to produce an increased number of semiconductor chips from a single wafer to thereby maximize cost reduction.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip, comprising:
    a body unit including one or more circuit units;
    a first bonding pad disposed on a first face of the body unit in a bonding pad region and connected to a circuit unit of the one or more circuit units; and
    a second bonding pad disposed on the first face of the body unit in the bonding pad region so as to be positioned in an adjacent surrounding area of the first bonding pad such that the second bonding pad borders at least one side face of the first bonding pad while being insulated from the first bonding pad, the second bonding pad being connected to a circuit unit of the one or more circuit units.

2. The semiconductor chip according to claim 1, further comprising:
    a first insulation layer interposed between the first bonding pad and the second bonding pad to insulate the first bonding pad from the second bonding pad.

3. The semiconductor chip according to claim 1, wherein the first bonding pad has a circular, elliptic or polygonal shape when viewed from the top.

4. The semiconductor chip according to claim 1, wherein the second bonding pad has a closed loop shape of a ring or a rectangle so as to surround the first bonding pad when viewed from the top.

5. The semiconductor chip according to claim 1, wherein the second bonding pad has a "C" shape or an "L" shape to border at least one side face of the first bonding pad when viewed from the top.

6. The semiconductor chip according to claim 1, wherein the first bonding pad and the second bonding pad are disposed in the first face of the body unit in plural pairs, the pair comprising the first bonding pad and the second bonding pad.

7. A semiconductor package, comprising:
    a semiconductor chip comprising:
        a body unit including one or more circuit units;
        a first bonding pad disposed in a first face of the body unit in a bonding pad region and connected to a circuit unit of the one or more circuit units; and
        a second bonding pad disposed in the first face of the body unit in the bonding pad region so as to be positioned in an adjacent surrounding area of the first bonding pad such that the second bonding pad borders at least one side face of the first bonding pad while being insulated from the first bonding pad, the second bonding pad being connected to a circuit unit of the one or more circuit units;
    a first connection terminal attached onto the first bonding pad; and
    a second connection terminal attached onto the second bonding pad and positioned in an adjacent surrounding area of the first connection terminal such that the second connection terminal borders at least one side face of the first connection terminal while being insulated from the first connection terminal.

8. The semiconductor package according to claim 7, further comprising:
    a second insulation layer interposed between the first connection terminal and the second connection terminal to insulate the first connection terminal from the second connection terminal.

9. The semiconductor package according to claim 7, further comprising:
    a substrate comprising:
    a first connection pad disposed in a portion of the substrate corresponding to the first connection terminal that is connected to the first bonding pad; and
    a second connection pad disposed in a portion of the substrate corresponding to the second connection terminal that is connected to the second bonding pad, the second connection pad being attached to the second connection pad and positioned in an adjacent surrounding area of the first connection pad such that the second connection pad borders at least one side face of the first connection pad while being insulated with the first connection pad.

10. The semiconductor package according to claim 9, further comprising:
    a first insulation layer interposed between the first bonding pad and the second bonding pad to insulate the first bonding pad from the second bonding pad; and
    a third insulation layer interposed between the first connection pad and the second connection pad to insulate the first connection pad from the second connection pad.

11. The semiconductor package according to claim 9, wherein the first bonding pad, the first connection terminal and the first connection pad have shapes corresponding to one another; and the second bonding pad, the second connection terminal and the second connection pad have shapes corresponding to one another.

12. The semiconductor package according to claim 9, wherein the first bonding pad, the first connection terminal and the first connection pad each have a circular, elliptic or polygonal shape when viewed from the top.

13. The semiconductor package according to claim 9, wherein the second bonding pad, the second connection terminal and the second connection pad each have a closed loop ring shape or a closed loop rectangle shape so as to surround the first bonding pad, the first connection terminal and the first connection pad, respectively, when viewed from the top.

14. The semiconductor package according to claim 9, wherein the second bonding pad, the second connection terminal and the second connection pad each have a "C" shape or a "L" shape to border at least one side face of the first bonding pad, the first connection terminal and the first connection pad, respectively, when viewed from the top.

15. The semiconductor package according to claim 7, wherein the first bonding pad and the second bonding pad are disposed in the first face of the body unit in plural pairs, the pair comprising the first bonding pad and the second bonding pad.

16. The semiconductor package according to claim 9, wherein the first and second connection pads are disposed in a first face of the substrate that faces the first face of the body unit; and wherein the substrate comprises a first ball land disposed in a second face of the substrate that is opposite to the first face of the substrate and a second ball land disposed in the second face and positioned in an adjacent surrounding area of the first ball land such that the second ball land borders at least one side face of the first ball land while being insulated from the first ball land.

17. The semiconductor package according to claim 16, further comprising:
 a fourth insulation layer interposed between the first ball land and the second ball land to insulate the first ball land from the second ball land, wherein the fourth insulation layer is protruded from the first and second ball lands.

18. The semiconductor package according to claim 16, further comprising:
 a first external connection terminal attached onto the first ball land, and
 a second external connection terminal attached onto the second ball land and positioned in an adjacent surrounding area of the first external connection terminal such that the second external connection terminal borders at least one side face of the first external connection terminal while being insulated from the first external connection terminal.

19. The semiconductor package according to claim 18, further comprising:
 a fifth insulation layer interposed between the first external connection terminal and the second external connection terminal to insulate the first external connection terminal from the second connection terminal.

20. The semiconductor package according to claim 18, wherein the first ball land and the first external connection terminal have shapes corresponding to each other, and the second ball land and the second external connection terminal have shapes corresponding to each other.

21. The semiconductor package according to claim 18, wherein the first ball land and the first external connection terminal each have a circular, elliptic or polygonal shape when viewed from the top.

22. The semiconductor package according to claim 18, wherein the second ball land and the second external connection terminal each have a closed loop ring shape or a closed loop rectangle shape so as to surround the first ball land and the first external connection terminal, respectively, when viewed from the top.

23. The semiconductor package according to claim 18, wherein the second ball land and the second external connection terminal each have a "C" shape or a "L" shape to border at least one side face of the first ball land and the first external connection terminal, respectively, when viewed from the top.

24. The semiconductor package according to claim 16, wherein the first ball land and the second ball land are disposed in the first face of the body unit in plural pairs, the pair comprising the first ball land and the second ball land.

* * * * *